(12) United States Patent
Kwon et al.

(10) Patent No.: US 12,272,409 B2
(45) Date of Patent: Apr. 8, 2025

(54) FLASH MEMORY DEVICE FOR ADJUSTING TRIP VOLTAGE USING VOLTAGE REGULATOR AND SENSING METHOD THEREOF

(71) Applicant: Samsung Electronics Co., Ltd., Suwon-si (KR)

(72) Inventors: Tae-Hong Kwon, Suwon-si (KR); Kiwhan Song, Suwon-si (KR); Gyosoo Choo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 155 days.

(21) Appl. No.: 18/176,347

(22) Filed: Feb. 28, 2023

(65) Prior Publication Data

US 2024/0029798 A1    Jan. 25, 2024

(30) Foreign Application Priority Data

Jul. 19, 2022    (KR) .................. 10-2022-0088787

(51) Int. Cl.
| | | |
|---|---|---|
| *G11C 7/22* | (2006.01) | |
| *G11C 16/04* | (2006.01) | |
| *G11C 16/20* | (2006.01) | |
| *G11C 16/26* | (2006.01) | |

(52) U.S. Cl.
CPC .......... *G11C 16/26* (2013.01); *G11C 16/0433* (2013.01); *G11C 16/20* (2013.01)

(58) Field of Classification Search
CPC ..... G11C 16/26; G11C 16/0433; G11C 16/20; G11C 5/147; G11C 2211/5642; G11C 7/04; G11C 11/5642; G11C 16/3418; G11C 16/30; G11C 16/24; G11C 29/021;
(Continued)

(56) References Cited

U.S. PATENT DOCUMENTS 6,826,082 B2 * 11/2004 Hwang .............. G11C 16/3459
                                                        365/185.17
7,016,229 B2    3/2006 Kim
(Continued)

FOREIGN PATENT DOCUMENTS

KR          100206875 B1    7/1999
KR      10-2018-0036880 A    4/2018

*Primary Examiner* — Tha-O H Bui
(74) *Attorney, Agent, or Firm* — Harness, Dickey & Pierce, P.L.C.

(57) ABSTRACT

Various example embodiments provide a flash memory device, comprising a cell string; a page buffer connected to the cell string and a bit line and configured to sense data stored in a selected memory cell by precharging a sensing node connected to the bit line; and a voltage regulator. The page buffer comprises a latch including first and second inverters coupled between a latch node and an inverted latch node; and a pull-down NMOS transistor for tripping the sensing result of the selected memory cell to the latch node. The voltage regulator adjusts a trip voltage by providing the source voltage to the pull-down NMOS transistor. The flash memory device reduce a trip voltage variation range by using only the pull-down NMOS transistor characteristics. Also, an OFF cell margin and an ON cell margin may be secured by adjusting the level of the trip voltage using the source voltage.

20 Claims, 15 Drawing Sheets

(58) Field of Classification Search
CPC ... G11C 29/028; G11C 16/0483; G11C 16/04; G11C 16/10
USPC .................................................. 365/189.011
See application file for complete search history.

(56) References Cited

U.S. PATENT DOCUMENTS

| | | | |
|---|---|---|---|
| 7,505,322 B2* | 3/2009 | Lee .................... | G11C 16/3418 |
| | | | 365/185.25 |
| 7,724,575 B2* | 5/2010 | Lee .................... | G11C 16/0483 |
| | | | 365/185.12 |
| 8,189,394 B2 | 5/2012 | Jin et al. | |
| 8,593,867 B2* | 11/2013 | Lee .................... | G11C 16/0483 |
| | | | 365/185.12 |
| 9,019,780 B1 | 4/2015 | Lin et al. | |
| 10,290,343 B2* | 5/2019 | Kim ....................... | G11C 16/24 |
| 11,227,651 B2 | 1/2022 | Banerjee et al. | |
| 2018/0096718 A1 | 4/2018 | Kim et al. | |
| 2021/0407597 A1 | 12/2021 | Park | |

\* cited by examiner

FLASH MEMORY DEVICE FOR ADJUSTING TRIP VOLTAGE USING VOLTAGE REGULATOR AND SENSING METHOD THEREOF

CROSS-REFERENCE TO RELATED APPLICATIONS

This application claims priority under 35 U.S.C. § 119 to Korean Patent Application No. 10-2022-0088787 filed on Jul. 19, 2022, in the Korean Intellectual Property Office, the disclosures of which are incorporated by reference herein in their entireties.

BACKGROUND

Various example embodiments relate to a semiconductor memory device, and more particularly, to a flash memory device for adjusting a trip voltage using a voltage regulator, and a sensing method thereof.

A semiconductor memory device may be classified as a volatile memory device or a non-volatile memory device. The volatile memory device is fast in read and write speeds, but loses data stored therein when power is turned off. In contrast, the non-volatile memory device retains data stored therein even when power is turned off but is comparatively slower in write speeds. The non-volatile memory device may be used in the case where data should be retained regardless of the power.

A flash memory device may be a representative example of the non-volatile memory device. Nowadays, like a vertical NAND flash memory device (VNAND), a technology for stacking memory cells in a three-dimensional structure is being actively developed to improve the degree of integration. In a vertical flash memory device, the number of word line layers stacked in a vertical direction is increasing with each generation. The number of string selection lines formed in the uppermost gate layer is also increasing.

As for a flash memory device, technologies to support the flash memory device are continuously developing in response to market requests for high capacity, high speed input/output, low power, and data reliability. Recently, the flash memory device has been widely used in small mobile devices. There is an increasing need for flash memory device to be driven with a low operating voltage in a low power environment. Therefore, studies for increasing a sensing margin of a flash memory device to ensure high data reliability with a low operating voltage are being actively conducted.

SUMMARY

The present invention provides a flash memory device capable of reducing a variation range of a trip voltage and improving a sensing margin in a low-power environment and a sensing method thereof. The flash memory device according to the embodiment of the present invention may reduce a trip voltage variation range by using only the pull-down NMOS transistor characteristics. Also, according to the present invention, an OFF cell margin and an ON cell margin may be sufficiently secured by adjusting the level of the trip voltage Vtrip using the source voltage Vs.

Various example embodiments provide a flash memory device, comprising a cell string including a plurality of memory cells; a page buffer connected to the cell string and a bit line and configured to sense data stored in a selected memory cell from among the plurality of memory cells by precharging a sensing node connected to the bit line; and a voltage regulator configured to provide a source voltage to the page buffer. Wherein the page buffer comprises a latch including first and second inverters coupled between a latch node and an inverted latch node; and a pull-down n-type metal-oxide-semiconductor ("NMOS") transistor configured to define a trip voltage provided to the latch node based on a result of the sensing of the data stored in the selected memory cell. Wherein the voltage regulator is configured to adjust the trip voltage by providing the source voltage to the pull-down NMOS transistor.

Alternatively or additionally, according to various example embodiments provide a flash memory device, comprising a first sensing latch coupled to a first bit line; a second sensing latch coupled to a second bit line; and a voltage regulator configured to provide a source voltage to the first and second sensing latches. Wherein each of the first and second sensing latches comprises, a latch comprising first and second inverters coupled between a latch node and an inverted latch node; and a pull-down n-type metal-oxide-semiconductor (NMOS) transistor configured to define a trip voltage, provided to the latch node, based on a result of sensing data stored a selected memory cell. Wherein the voltage regulator is configured to adjust the trip voltage by providing the source voltage to the pull-down NMOS transistor.

Alternatively or additionally, according to various example embodiments provide a sensing method of a flash memory device, comprising precharging a sensing node connected to a bit line; developing the precharged charges in the sensing node according to data stored in a selected memory cell; providing a source voltage to a sensing latch coupled to the sensing node; and defining a trip voltage provided to a latch node of the sensing latch based on the data stored in the selected memory cell and on the source voltage provided to the sensing latch.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
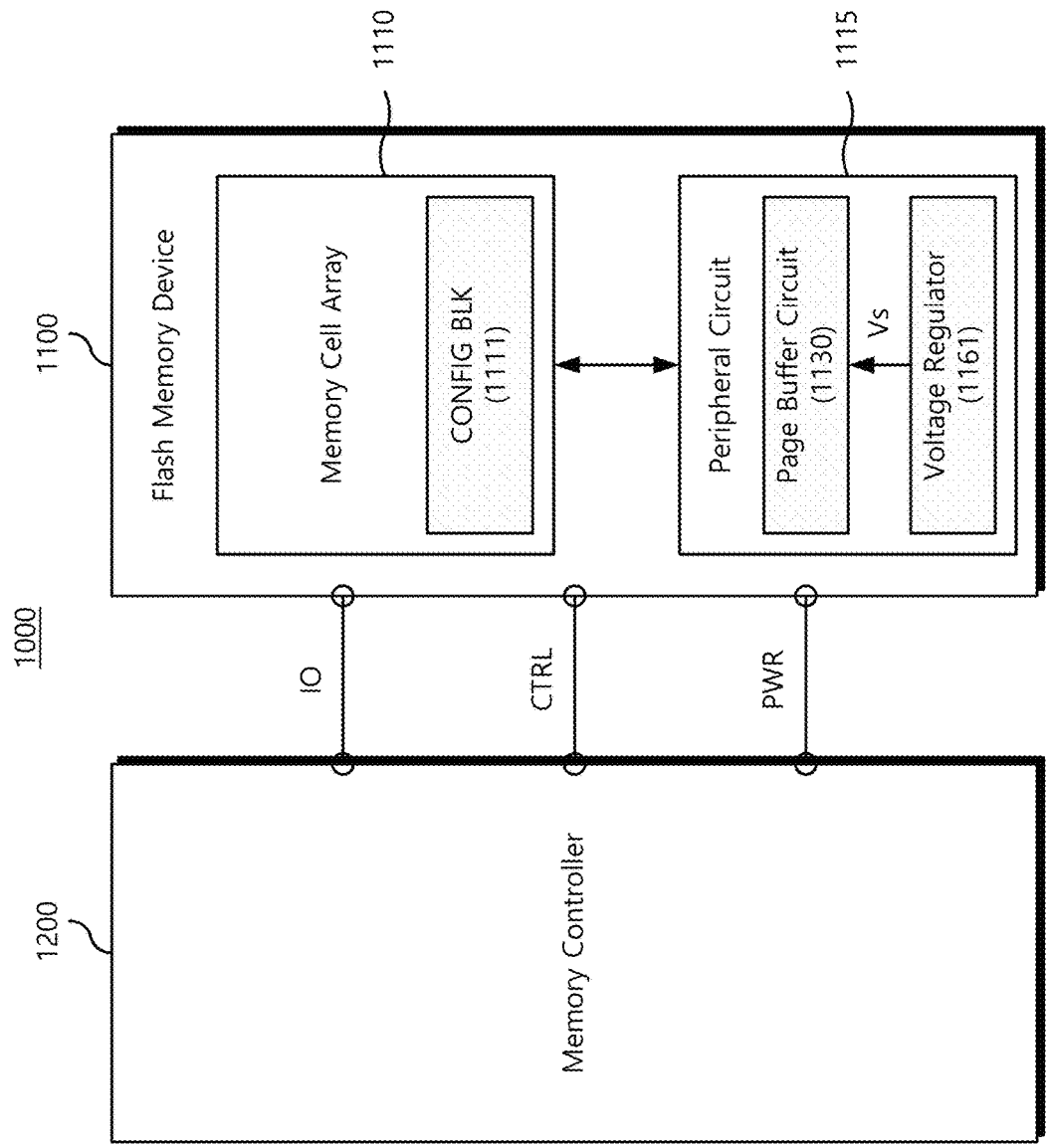
FIG. 1 is a block diagram illustrating a data storage device according to various example embodiments.

Hereinafter, example embodiments of the present disclosure will be described with reference to the accompanying drawings. In the following description, the same elements will be designated by the same reference numerals although they are shown in different drawings. Further, in the following description of the present disclosure, a detailed description of known functions and configurations incorporated herein will be omitted when it may make the subject matter of the present disclosure unclear.

In addition, it will be understood that the spatially relative terms are intended to encompass different orientations of the device in use or operation in addition to the orientation depicted in the figures. For example, if the device in the figures is otherwise oriented (e.g., rotated 90 degrees or at other orientations), the spatially relative descriptors used herein are to be interpreted accordingly.

When the terms "about" or "substantially" are used in this specification in connection with a numerical value, it is intended that the associated numerical value includes a manufacturing tolerance (e.g., ±10%) around the stated numerical value. Further, regardless of whether numerical values are modified as "about" or "substantially," it will be understood that these values should be construed as including a manufacturing or operational tolerance (e.g., ±10%) around the stated numerical values.

FIG. 1 is a block diagram illustrating a data storage device according to various example embodiments. Referring to FIG. 1, a data storage device 1000 may include a flash memory device 1100 and a memory controller 1200. The flash memory device 1100 and the memory controller 1200 may be connected through, e.g., a data input/output line IO, a control line CTRL, and a power line PWR.

The memory controller 1200 may include processing circuitry such as hardware, software, or a combination thereof configured to perform a specific function. For example, the processing circuitry more specifically may be and/or include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), electrical components (such as at least one of transistors, resistors, capacitors, logic gates (including at least one of AND gates, OR gates, NOR gates, NAND gates, NOT gates, XOR gates, etc.), and/or the like), etc.

Under control of the memory controller 1200, the data storage device 1000 may store data in the flash memory device 1100. The flash memory device 1100 includes a memory cell array 1110 and a peripheral circuit 1115.

The memory cell array 1110 may be provided next to the peripheral circuit 1115 and/or on the peripheral circuit 1115 on a design/layout structure. A structure where the memory cell array 1110 is provided on the peripheral circuit 1115 may be referred to as a cell on peripheral (COP) structure. The memory cell array 1110 may include a configuration memory block 1111 (CONFIG_BLK) for storing configuration data. The digital code stored in the configuration memory block 1111 may be loaded into the peripheral circuit 1115 when the flash memory 1100 is booted.

The peripheral circuit 1115 may include both analog circuits and digital circuits configured to store data in the memory cell array 1110 and/or to read data stored in the memory cell array 1110. The peripheral circuit 1115 may receive external power (PWR) from the memory controller 1200 and generate various levels of internal power.

The peripheral circuit 1115 may receive commands, addresses, and data from the memory controller 1200 through the input/output line M. The peripheral circuit 1115 may store data in the memory cell array 1110 according to the control of the control signal CTRL. Also, the peripheral circuit 1115 may read data stored in the memory cell array 1110 and provide it to the memory controller 1200.

The peripheral circuit 1115 may include a page buffer circuit 1130 and a voltage regulator 1161. When the flash memory 1100 is booted, the voltage regulator 1161 may receive digital codes from the configuration memory block 1111. The voltage regulator 1161 may generate an analog source voltage Vs using the digital codes. The source voltage Vs of the voltage regulator 1161 may be provided to the page buffer circuit 1130. The page buffer circuit 1130 may perform a sensing operation using the source voltage Vs.

The flash memory device 1100 according to various example embodiments of the present invention may improve the sensing operation of the page buffer circuit 1130 by using the source voltage Vs generated by the voltage regulator 1161. For example, as explained in further detail below, the flash memory device 1100 may reduce a variation range of the trip voltage Vtrip and/or improve a sensing margin during a sensing operation of the page buffer circuit 1130.

Figure 2:
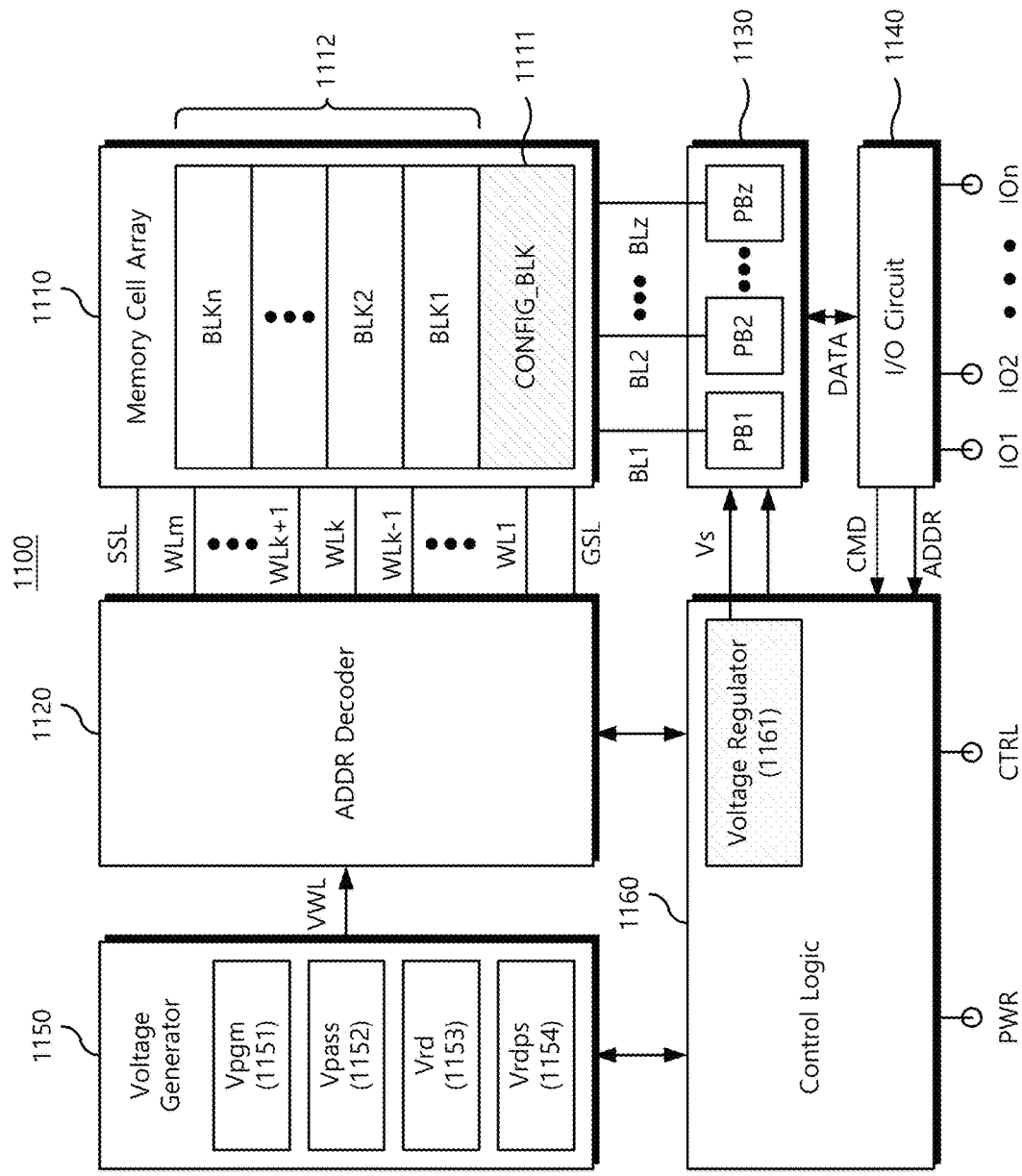
FIG. 2 is a block diagram illustrating a flash memory device illustrated in FIG. 1.

FIG. 2 is a block diagram illustrating a flash memory device illustrated in FIG. 1. Referring to FIG. 2, the flash memory device 1100 may include the memory cell array 1110, an address decoder 1120, a page buffer circuit 1130, a data input/output circuit 1140, a voltage generator 1150, and control logic 1160.

The memory cell array 1110 may include a plurality of memory blocks. In at least some embodiments, each memory block may have a vertical three-dimensional structure. Each memory block may be composed of a plurality of memory cells. Multi-bit data may be stored in each memory cell.

The memory cell array 1110 may include a configuration memory block 1111 configured to store, e.g., configuration data and memory blocks 1112 (BLK1 to BLKn) configured to store, e.g., general data. The configuration data may be loaded into the control logic 1160 when the flash memory device 1100 is booted. The configuration data may be used as digital codes for setting various operations of the flash memory device 1100. For example, the configuration data may be used to set an operating voltage, an operating condition, and an operating time of a read operation of the flash memory device 1110.

In at least some embodiments, the memory block 1112 may be formed in a direction perpendicular to a substrate. A gate electrode layer and an insulation layer may be alternately and repeatedly deposited on the substrate. The gate electrode layers of the memory block (e.g., BLK1) may be connected with a string selection line SSL, a plurality of word lines WL1 to WLm, and a ground selection line GSL.

The address decoder 1120 may be connected with the memory cell array 1110 through the selection lines SSL and GSL, and the word lines WL1 to WLm. The address decoder 1120 may select a word line in the program or read operation. The address decoder 1120 may receive a word line voltage VWL from the voltage generator 1150 and may provide the selected word line with the program voltage and/or the read voltage.

The page buffer circuit 1130 may be coupled with the memory cell array 1110 through bit lines BL1~BLz. The page buffer circuit 1130 may temporarily store data to be programmed in the memory cell array 1110 and/or data read from the memory cell array 1110. The page buffer circuit 1130 may include page buffers PB1~PBz that are coupled with a corresponding bit line BL~BLz. Each page buffer may include a plurality of latches for the purpose of storing and/or reading multi-bit data.

The data input/output circuit 1140 may be internally connected with the page buffer circuit 1130 through data lines and may be externally connected with the memory controller 1200 (refer to FIG. 1) through input/output lines IOI to IOn. During the program operation, the data input/output circuit 1140 may receive program data from the memory controller 1200. During the read operation, the data input/output circuit 1140 may provide the memory controller 1200 with data read from the memory cell array 1110.

The voltage generator 1150 may be supplied with an internal power from the control logic 1160 and may generate the word line voltage VWL used to read or write data. The word line voltage VWL may be provided to a selected word line sWL and/or unselected word lines uWL through the address decoder 1120.

The voltage generator 1150 may include a program voltage (VPGM) generator 1151 and a pass voltage (VPASS) generator 1152. The program voltage generator 1151 may generate the program voltage VPGM that is provided to the selected word line sWL during the program operation. The pass voltage generator 1152 may generate the pass voltage VPASS that is provided to the selected word line sWL and the unselected word line uWL.

The voltage generator 1150 may further include a read voltage (Vrd) generator 1153 and a read pass voltage (Vrdps) generator 1154. The read voltage generator 1153 may generate a selection read voltage Vrd that is provided to the selected word line sWL during the read operation. The read pass voltage generator 1154 may generate a read pass voltage Vrdps that is provided to the unselected word line uWL. The read pass voltage Vrdps may be a voltage sufficient to turn on memory cells connected with the unselected word line uWL during the read operation.

The control logic 1160 may control the program, read, and erase operations of the flash memory device 1100 by using a command CMD, an address ADDR, and the control signal CTRL provided from the memory controller 1200. The address ADDR may include a block address (or block selection address) that indicates, and may be used for selecting, one memory block, and a row address and a column address that indicate, and may be used for selecting, one memory cell of the selected memory block.

The control logic 1160 may include a voltage regulator 1161. The voltage regulator 1161 may receive configuration data from the memory cell array 1110 and generate a source voltage Vs. The voltage regulator 1161 may generate a source voltage Vs for controlling a sensing operation of the flash memory 1100 by using the configuration parameter.

The voltage regulator 1161 may have an on and off state. When the voltage regulator 1161 is in an off state, the source voltage Vs may not be provided to the page buffer circuit 1130. When the voltage regulator 1161 is in an on state, the source voltage Vs may be provided to the page buffer circuit 1130.

When the voltage regulator 1161 is in the on state, the first to z-th page buffers PB1 to PBz of the page buffer circuit 1130 may receive the source voltage Vs from the voltage regulator 1161. The voltage regulator 1161 may provide a source voltage Vs to each of the first to z-th page buffers PB1 to PBz. Alternatively, the voltage regulator 1161 may provide the source voltage Vs to all or some of the first to z-th page buffers PB1 to PBz.

The first to z-th page buffers PB1 to PBz may perform a sensing operation using the source voltage Vs provided from the voltage regulator 1161. The first to z-th page buffers PB1 to PBz may use the source voltage Vs to reduce a variation range of the trip voltage Vtrip during a sensing operation and improve a sensing margin.

Figure 3:
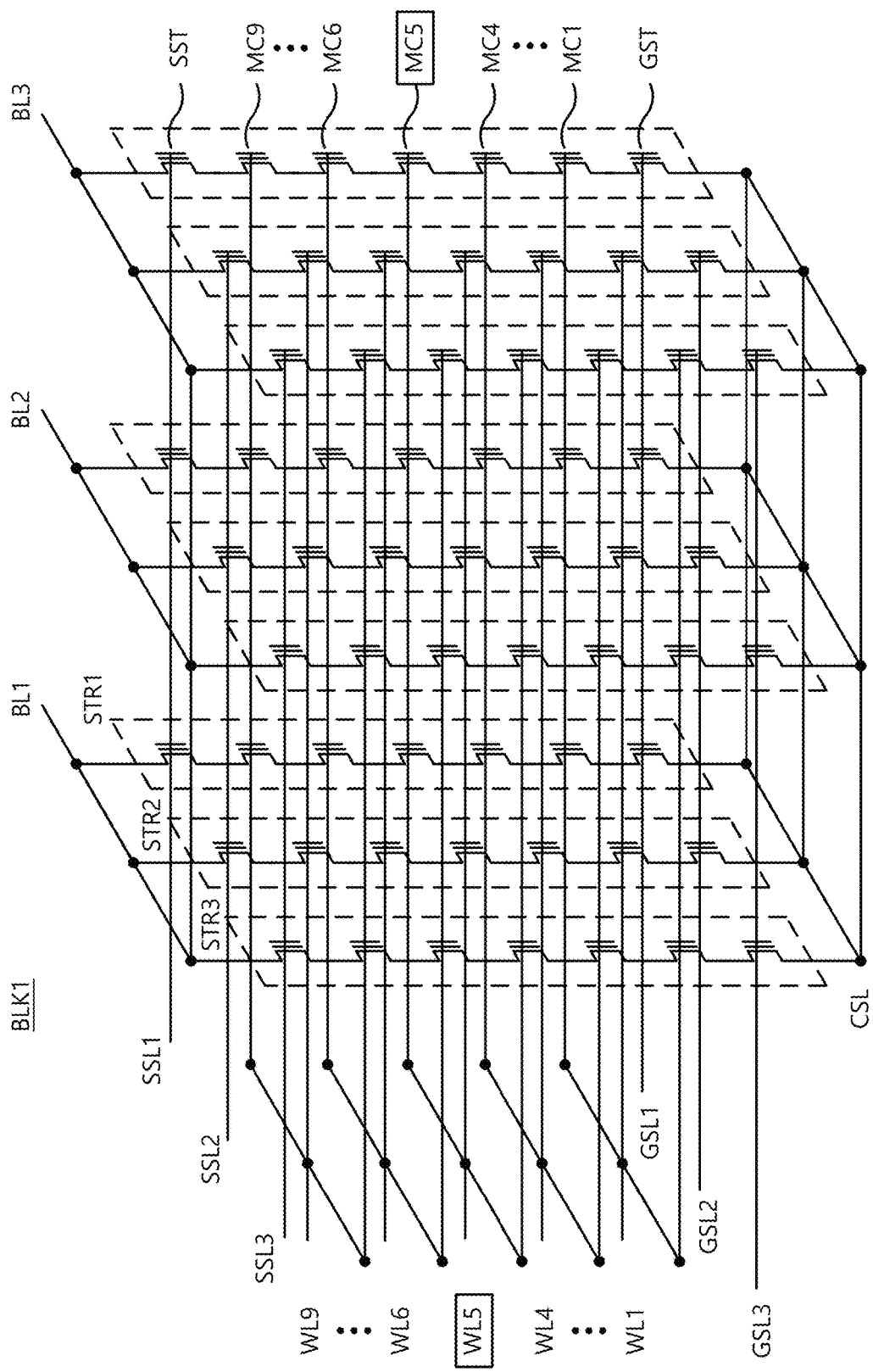
FIG. 3 is a circuit diagram illustrating a memory block BLK1 of the memory cell array shown in FIG. 2.

FIG. 3 is a circuit diagram illustrating a memory block BLK1 of the memory cell array shown in FIG. 2. In FIG. 3, first to ninth word lines WL1 to WL9, first to ninth memory cells MC1 to MC9, first to third bit lines BL1 to BL3, and first to third ground selections Lines GSL1 to GSL3 and first to third cell strings STR1 to STR3 are shown.

Referring to FIG. 3, in the memory block BLK1, a plurality of cell strings STR1 to STR3 are formed between the plurality of bit lines BL1 to BL3 and the common source line CSL. Each cell string includes a string select transistor SST, a plurality of memory cells MC1 to MC9, and a ground select transistor GST. The example embodiments may include, for example, more and/or fewer of the plurality of cell strings STR1 to STR3, the plurality of bit lines BL1 to BL3, string select transistors SST, ground transistor GST, plurality of memory cells MC1 to MC9, etc. than what is illustrated.

The string selection transistors SST are connected to the plurality of string selection lines SSL1 to SSL3. The ground selection transistors GST are connected to the plurality ground selection lines GSL1 to GSL3. The string select transistors SST are connected to the bit lines BL1 to BL3, and the ground select transistors GST are connected to a common source line CSL.

The plurality of memory cells MC1 to MC9 are connected to the plurality of word lines WL1 to WL9. The first word line WL1 may be positioned on the first to third ground selection lines GSL1 to GSL3. First memory cells MC1 at the same height from the substrate may be connected to the first weed line WL1. The fourth memory cells MC4 at the same height from the substrate may be connected to the fourth weed line WL4. Similarly, the sixth memory cells MC6 and the ninth memory cells MC9 may be connected to the sixth word line WL6 and the ninth word line WL9, respectively.

Fifth memory cells MC5 at the same height from the substrate may be connected to the fifth selection word line WL5. The fifth word line WL5 may be a selected word line sWL (selected WL). The fifth memory cell MC5 may be a selected MC (sMC). Meanwhile, the first page buffer PB1 may be connected to the first bit line BL1. Similarly, the second page buffer PB2 may be connected to the second bit line BL2. In addition, the third page buffer PB3 may be connected to the third bit line BL3.

Figure 4:
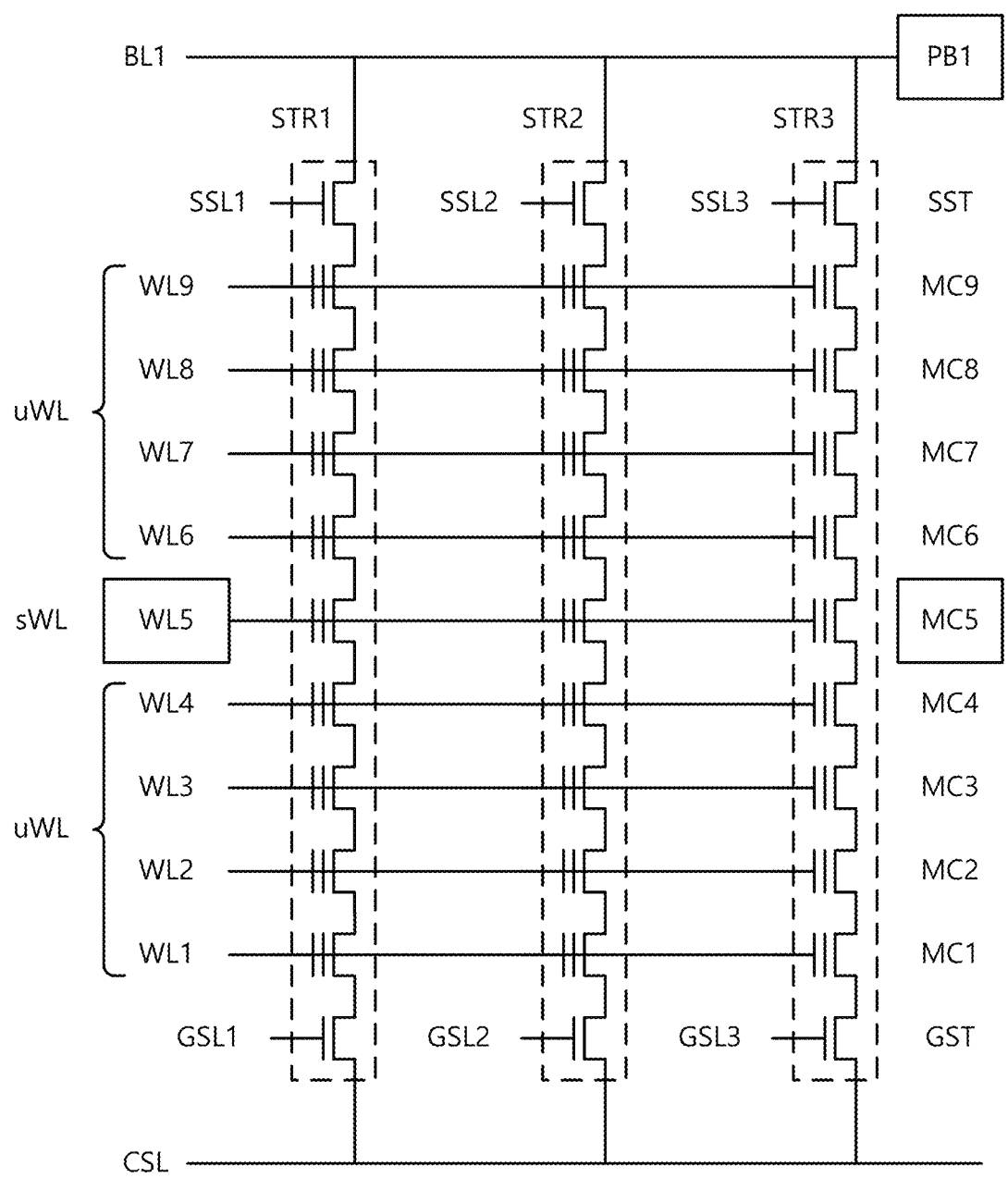
FIG. 4 is a circuit diagram illustrating cell strings STR1 to STR3 connected to the first bit line BL1 and the common source line CSL among the cell strings of the memory block BLK1 shown in FIG. 3.

FIG. 4 is a circuit diagram illustrating cell strings STR1 to STR3 connected to the first bit line BL1 and the common source line CSL among the cell strings of the memory block BLK1 shown in FIG. 3. A first page buffer PB1 is connected to the first bit line BL1. The first to third cell strings STR1 to STR3 may be selected by the first to third string selection lines SSL1 to SSL3, respectively.

For example, the first cell string STR1 may be selected by the first string selection line SSL1. In the first cell string STR1, the string select transistors SST selected by the first string select line SSL1, first to ninth memory cells MC1 to MC9 controlled by the first to ninth word lines WL1 to WL9, and ground select transistors GST selected by the first ground select line GSL1 may be included.

The first to fourth word lines WL1 to WL4 and the sixth to ninth word lines WL6 to WL9 may be unselected word lines uWL. The first to fourth memory cells MC1 to MC4 and the sixth to ninth memory cells MC6 to MC9 may be unselected memory cells ("uMC"). The fifth word line WL5 may be a selected word line sWL. The fifth memory cell MC5 may be a selected MC ("sMC").

Figure 5:
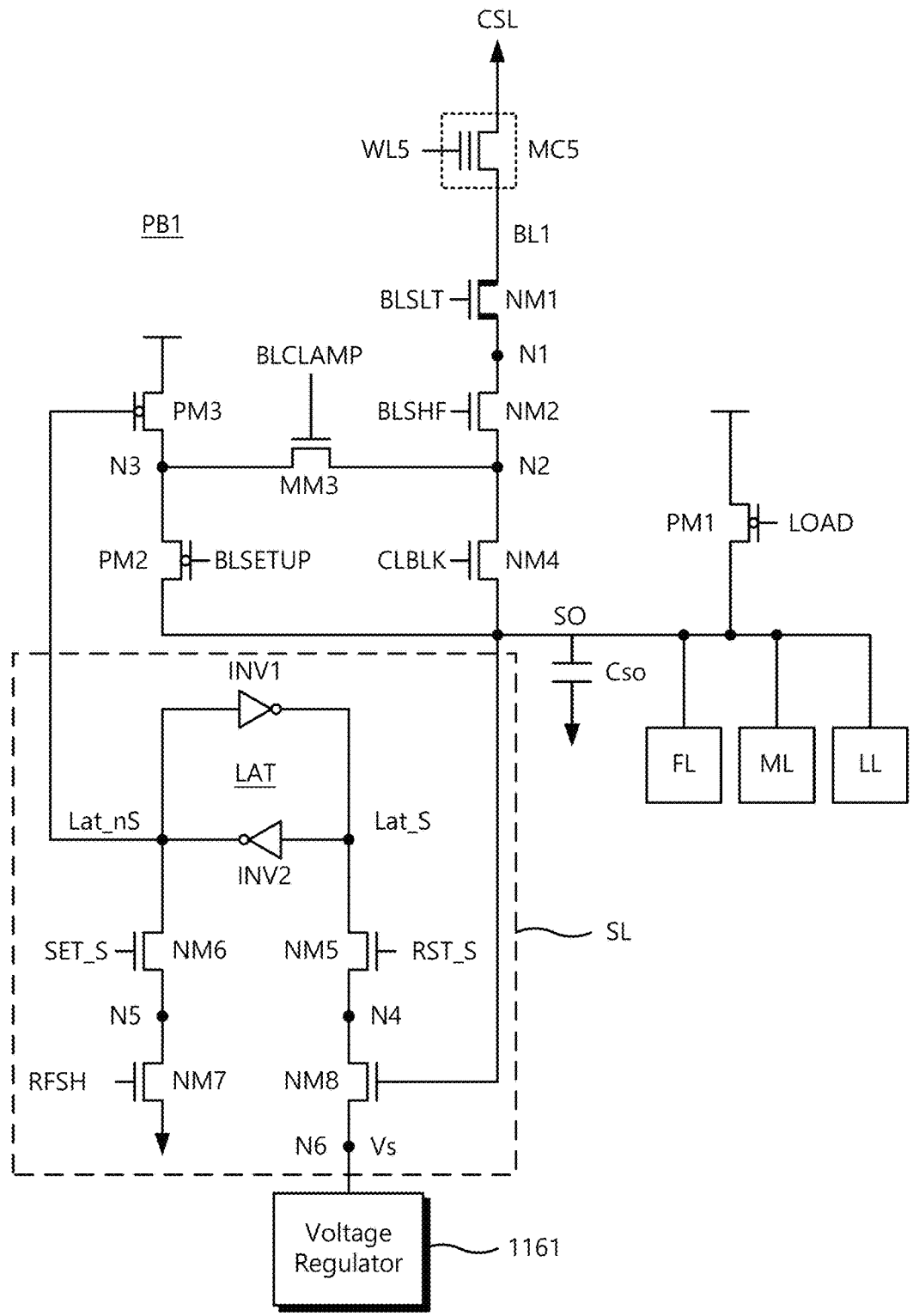
FIG. 5 is a circuit diagram illustrating the first page buffer PB1 shown in FIG. 2 and FIG. 4.

FIG. 5 is a circuit diagram illustrating the first page buffer PB1 shown in FIG. 2 and FIG. 4. Referring to FIG. 5, the first page buffer PB1 is connected to the first bit line BL1. A fifth memory cell MC5 that is a selected memory cell sMC may be connected to the first bit line BL1. A fifth word line WL5 that is a selected word line sWL may be connected to the fifth memory cell MC5. The first bit line BL1 may be connected to the common source line CSL through the fifth memory cell MC5.

A first n-channel metal-oxide-semiconductor (NMOS) transistor NM1 may be included between the first bit line BL1 and the first node N1. The first NMOS transistor NM1 may be a bit line select transistor driven by the bit line select signal BLSLT. The bit line select transistor may be implemented as a high voltage transistor. The bit line select transistor may be disposed in, e.g., a high voltage region.

A second NMOS transistor NM2 may be included between the first node N1 and the second node N2. The second NMOS transistor NM2 may be a bit line shut-off transistor driven by the bit line shut-off signal BLSHF. A third NMOS transistor NM3 may be included between the second node N2 and the third node N3. The third NMOS transistor NM3 may be a bit line clamping transistor driven by the bit line clamping control signal BLCLAMP. A fourth NMOS transistor NM4 may be included between the second node N2 and the sensing node SO. The fourth NMOS transistor NM4 may be a bit line connection transistor driven by the bit line connection control signal CLBLK.

A first p-channel metal-oxide-semiconductor (PMOS) transistor PM1 may be included between the sensing node SO and the power terminal. The first PMOS transistor PM1 may be a precharge load transistor driven by the load signal LOAD. A second PMOS transistor PM2 may be included between the sensing node SO and the third node NM3. The second PMOS transistor PM2 may be a bit line setup transistor driven by the bit line setup signal BLSETUP. A third PMOS transistor PM3 may be included between the third node NM3 and the power terminal. The third PMOS transistor PM3 may be a precharge transistor driven by the inverted latch node Lat_nS.

A sensing latch SL, a force latch FL, a most significant bit latch ML, and a least significant bit latch LL may be connected to the sensing node SO. The sensing latch SL may store data stored in the selected memory cell sMC and/or a sensing result of the threshold voltage of the selected memory cell sMC during a read or program verify operation. Also, the sensing latch SL may be used to apply a program bit line voltage and/or a program inhibit voltage to the first bit line BL1 during a program operation. The force latch FL may be used to improve threshold voltage distribution during a program operation. The most significant bit latch ML and the least significant bit latch LL may be utilized to store data inputted from the outside during a program operation.

The sensing latch SL may include a latch LAT connected between the latch node Lat_S and the inverted latch node Lat_nS. The latch LAT may include first and second inverters INV1 and INV2. An input terminal of the first inverter INV1 and an output terminal of the second inverter INV2 may be connected to the inverted latch node Lat_nS. An output terminal of the first inverter INV1 and an input terminal of the second inverter INV2 may be connected to the latch node Lat_S.

The inverted latch node Lat_nS may be connected to the gate terminal of the third PMOS transistor PM3. When the inverted latch node Lat_nS is at a low level, the third PMOS transistor PM3 may be turned on, and the third node N3 may become a power supply voltage level. When the inverted latch node Lat_nS is at a high level, the power terminal and the third node N3 may be cut off.

A fifth NMOS transistor NM5 may be included between the latch node Lat_S and the fourth node N4. The fifth NMOS transistor NM5 may be used to reset the latch node Lat_S in response to the latch reset signal RST_S. The latch reset signal RST_S may be provided from the control logic (refer to FIG. 2, 1160). A sixth NMOS transistor NM6 may be included between the inverted latch node Lat_nS and the fifth node N5. The sixth NMOS transistor NM6 may be used to set the latch node Lat_S in response to the latch set signal SET_S. The latch set signal SET_S may be provided from the control logic (refer to FIG. 2, 1160).

A seventh NMOS transistor NM7 may be included between the fifth node N5 and the ground terminal. The seventh NMOS transistor NM7 may adjust the voltage level of the fifth node N5 in response to the refresh signal RFSH. The refresh signal RFSH may be provided from the control logic (refer to FIG. 2, 1160). An eighth NMOS transistor NM8 may be included between the fourth node N4 and the sixth node N6. The eighth NMOS transistor NM8 may adjust the voltage level of the fourth node N4 in response to the voltage level of the sensing node SO. A voltage regulator 1161 may be connected to the sixth node N6. The voltage regulator 1161 may provide the source voltage Vs to the sixth node N6.

Figure 6:
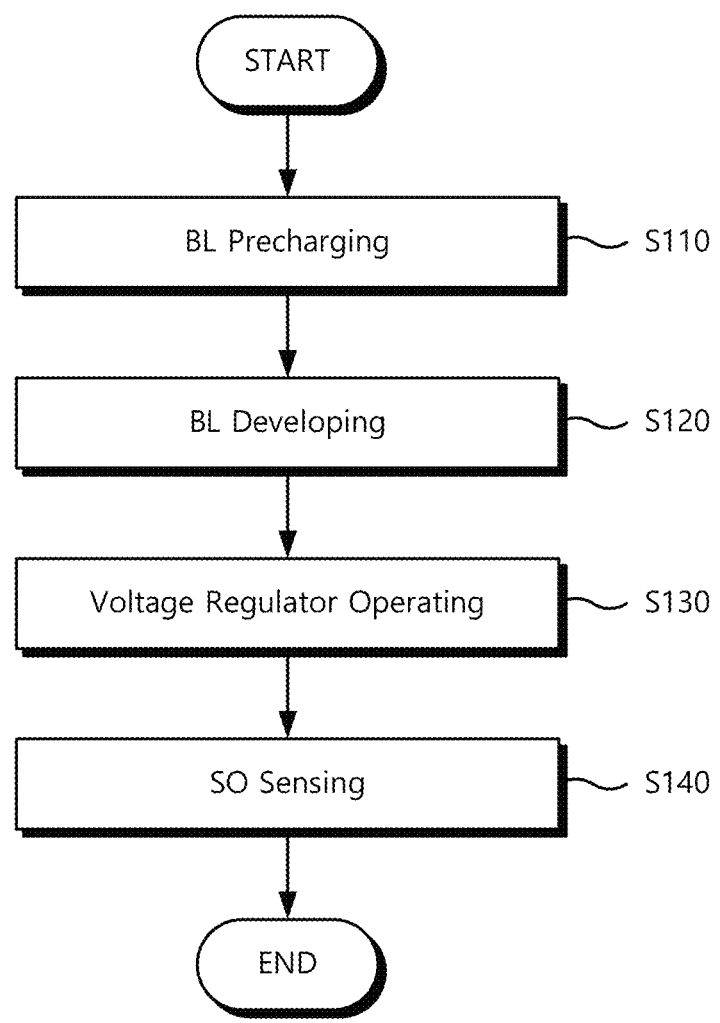
FIG. 6 is a flowchart illustrating a sensing operation of the first page buffer PB1 illustrated in FIG. 5.

FIG. 6 is a flowchart illustrating a sensing operation of the first page buffer PB1 illustrated in FIG. 5. Referring to FIG. 6, the first page buffer PB1 may perform a bit line precharge operation S110, a bit line develop operation S120, a voltage regulator operation S130, and an SO node sensing operation S140.

In step S110, the first page buffer PB1 may perform a bit line precharge operation. The first page buffer PB1 turns on the first and second PMOS transistors PM1 and PM2 and the first to fourth NMOS transistors NM1 to NM4 to precharge the first bit line BL1. In order to turn on the first and second PMOS transistors PM1 and PM2, the load signal LOAD and the bit line setup signal BLSETUP may be 0V or a ground voltage. At this time, the SO node and the first bit line BL1 may be precharged to a predetermined (or otherwise determined) voltage level.

In step S120, the first page buffer PB1 may perform a bit line develop operation. During the bit line develop operation, the bit line setup signal BLSETUP may transition to a high level, and the first and second PMOS transistors PM1 and PM2 may be turned off. In addition, the first to fourth NMOS transistors NM1 to NM4 may maintain a turned-on state. As described below, according to whether the fifth memory cell MC5 is an on-cell or an off-cell, the charge precharged in the first bit line BL1 or the SO node may escape or be maintained in the common source line CSL.

In step S130, the voltage regulator 1161 may operate. The sensing latch SL of the first page buffer PB1 may receive the source voltage Vs from the voltage regulator 1161. While the voltage regulator 1161 is operating, the level of the bit line clamping control signal BLCLAMP may be lower than that of the precharge stage. In this case, the voltage level of the SO node may be maintained above a certain level. For example, the voltage level of the SO node may be maintained above BLCLAMP-Vth (e.g., about 0.7V).

In step S140, the sensing latch SL may perform an SO node sensing operation. During the SO node sensing operation, the fifth NMOS transistor NM5 may be turned on, and the sixth and seventh NMOS transistors NM6 and NM7 may be turned off. The eighth NMOS transistor NM8 may perform a turn-on or turn-off operation according to the level of the SO node.

When the fifth memory cell MC5 is an OFF cell, the voltage level of the SO node maintains a precharge state. At this time, the eighth NMOS transistor NM8 is turned on, and the latch node Lat_S will transition to a low level. On the other hand, when the fifth memory cell MC5 is an ON cell, the voltage level of the SO node may be a ground state. At this time, the eighth NMOS transistor NM8 is turned off, and the latch node Lat_S maintains a high level state.

The first page buffer PB1 may use the source voltage Vs provided from the voltage regulator 1161 to reduce a variation range of a trip voltage Vtrip during an SO node sensing operation and may have a sufficient on-cell sensing margin.

Figure 7:
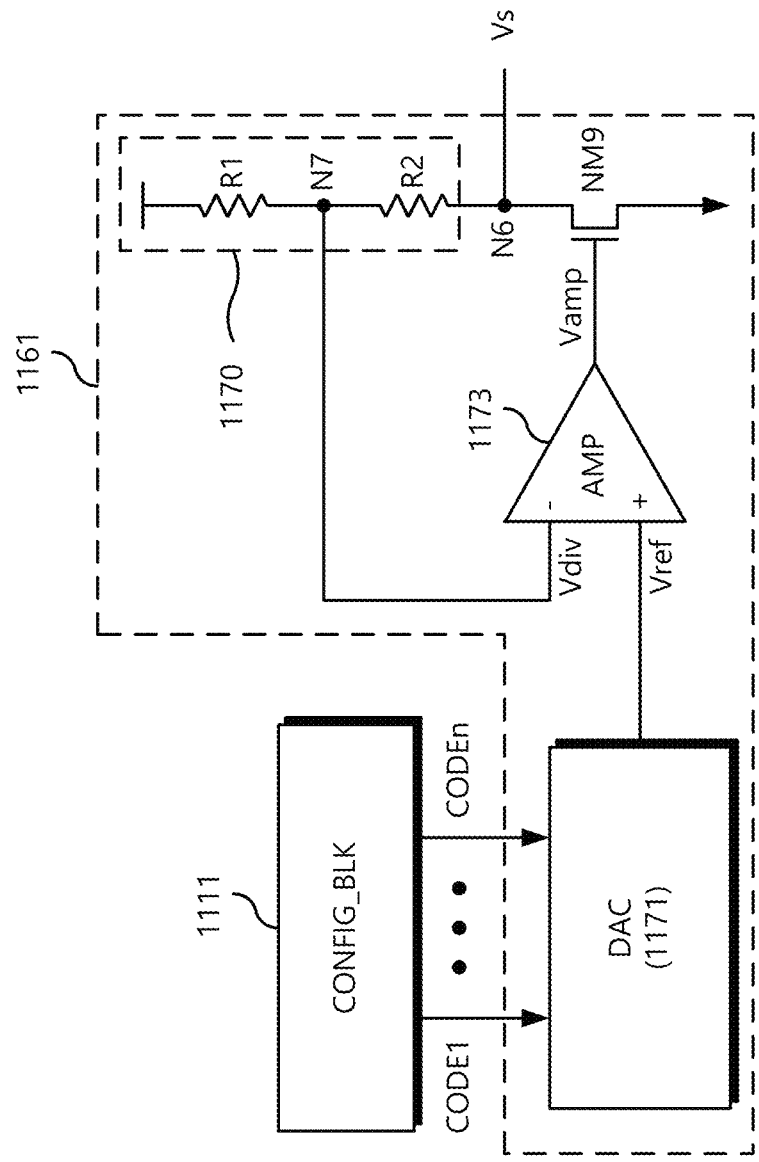
FIG. 7 is a block diagram illustrating the voltage regulator shown in FIG. 5.

FIG. 7 is a block diagram illustrating the voltage regulator shown in FIG. 5. Referring to FIG. 7, the voltage regulator 1161 may include a voltage divider 1170, a digital/analog ("DA") converter DAC 1171, an amplifier AMP 1173, and a ninth NMOS transistor NM9.

The voltage regulator 1161 may receive digital codes CODE1 to CODEn from the configuration memory block 1111 (refer to FIG. 2). The voltage regulator 1161 may provide the source voltage Vs to the sixth node N6 using digital codes. The source voltage Vs may be provided to the source terminal of the eighth NMOS transistor NM8.

The voltage divider 1170 may be connected between the power terminal and the sixth node N6. The voltage divider 1170 may include first and second resistors R1 and R2. The first resistor R1 may be connected between the power terminal and the seventh node N7. The second resistor R2 may be connected between the sixth node N6 and the seventh node N7. The voltage divider 1170 may provide the divided voltage Vdid to the amplifier 1173. The divided voltage Vdid may be the voltage of the seventh node N7.

The DA converter 1171 may receive the first to nth digital codes CODE1 to CODEn from the configuration memory block 1111 and convert them into analog voltages. The DA converter 1171 may provide the DAC output voltage to the amplifier 1173 as a reference voltage Vref.

The amplifier 1173 may include a plus (+) input terminal, a minus (−) input terminal, and an output terminal. The amplifier AMP 1173 may receive the reference voltage Vref through the (+) input terminal and the divided voltage Vdid through the (−) input terminal. The amplifier 1173 may generate the amplifier output voltage Vamp by using the reference voltage Vref and the divided voltage Vdid.

The ninth NMOS transistor NM9 may be connected between the sixth node N6 and the ground terminal. The ninth NMOS transistor NM9 may adjust the voltage level of the sixth node N6 in response to the voltage level of the amplifier output voltage Vamp. The voltage regulator 1161 may provide the source voltage Vs to the sixth node N6. The source voltage Vs may be provided to the source terminal of the eighth NMOS transistor NM8.

Figure 8:
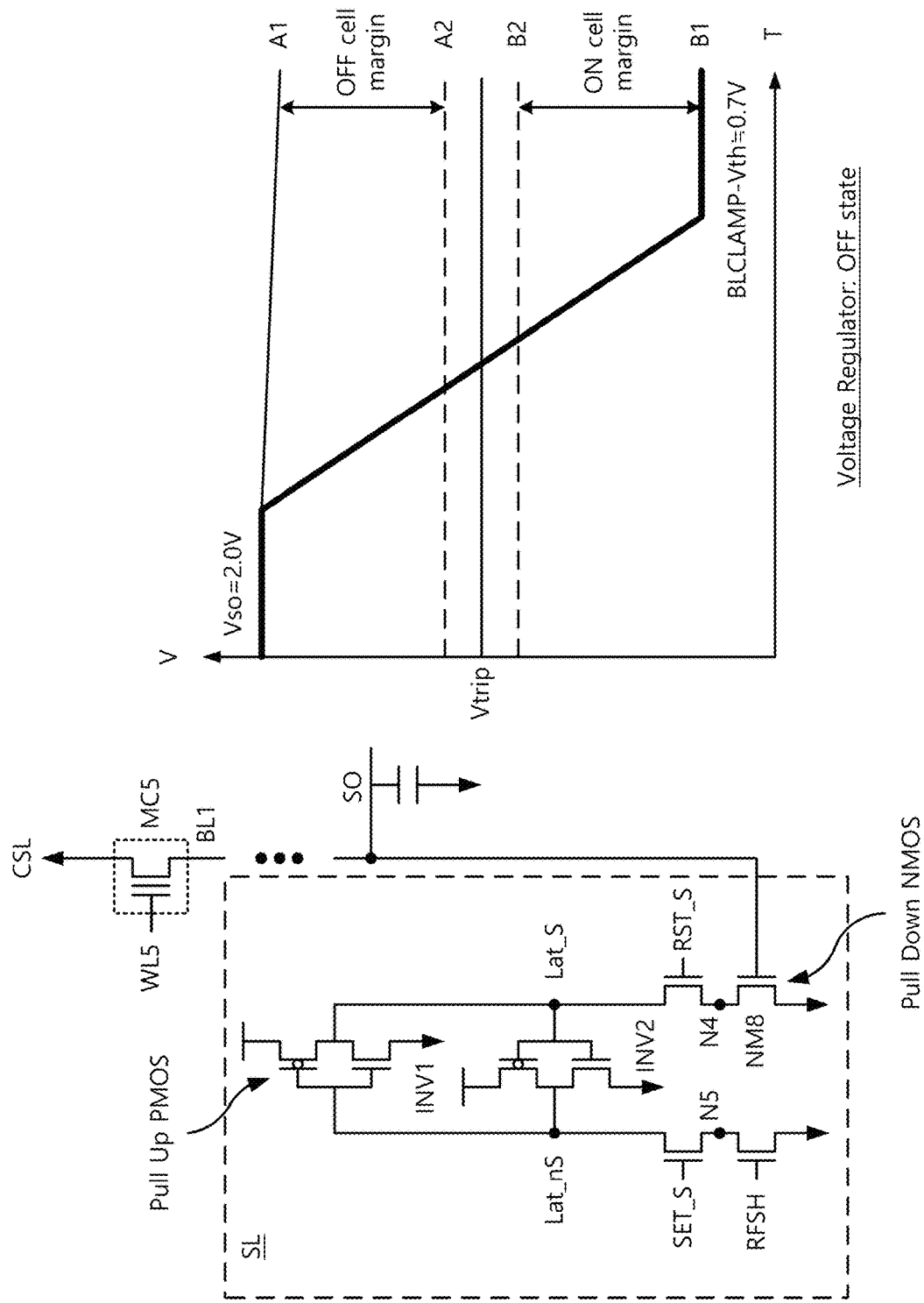
FIG. 8 to FIG. 12 are circuit diagrams and graphs for explaining an SO node sensing operation result according to an operation state of a voltage regulator.
Figure 9:
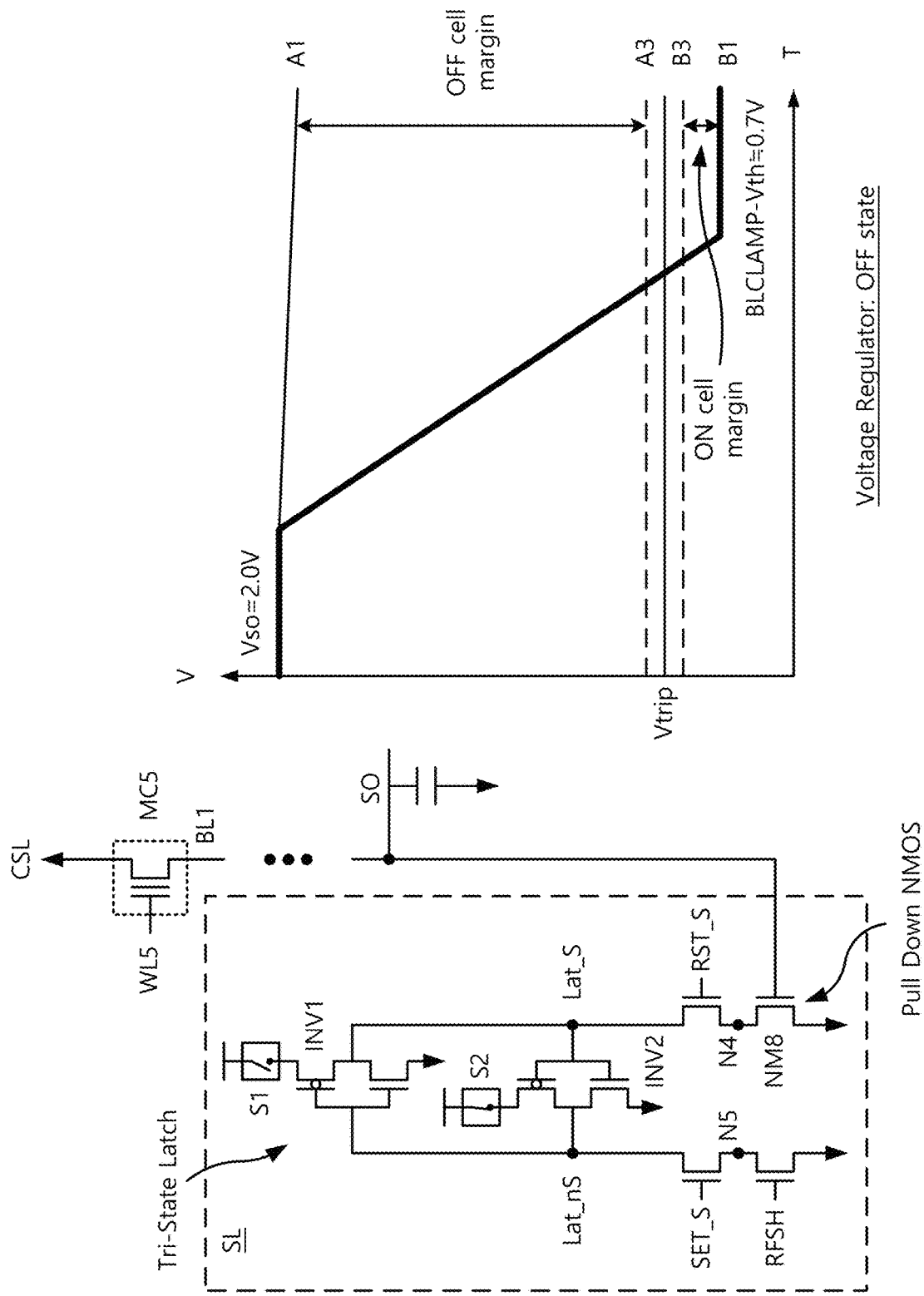
Figure 10:
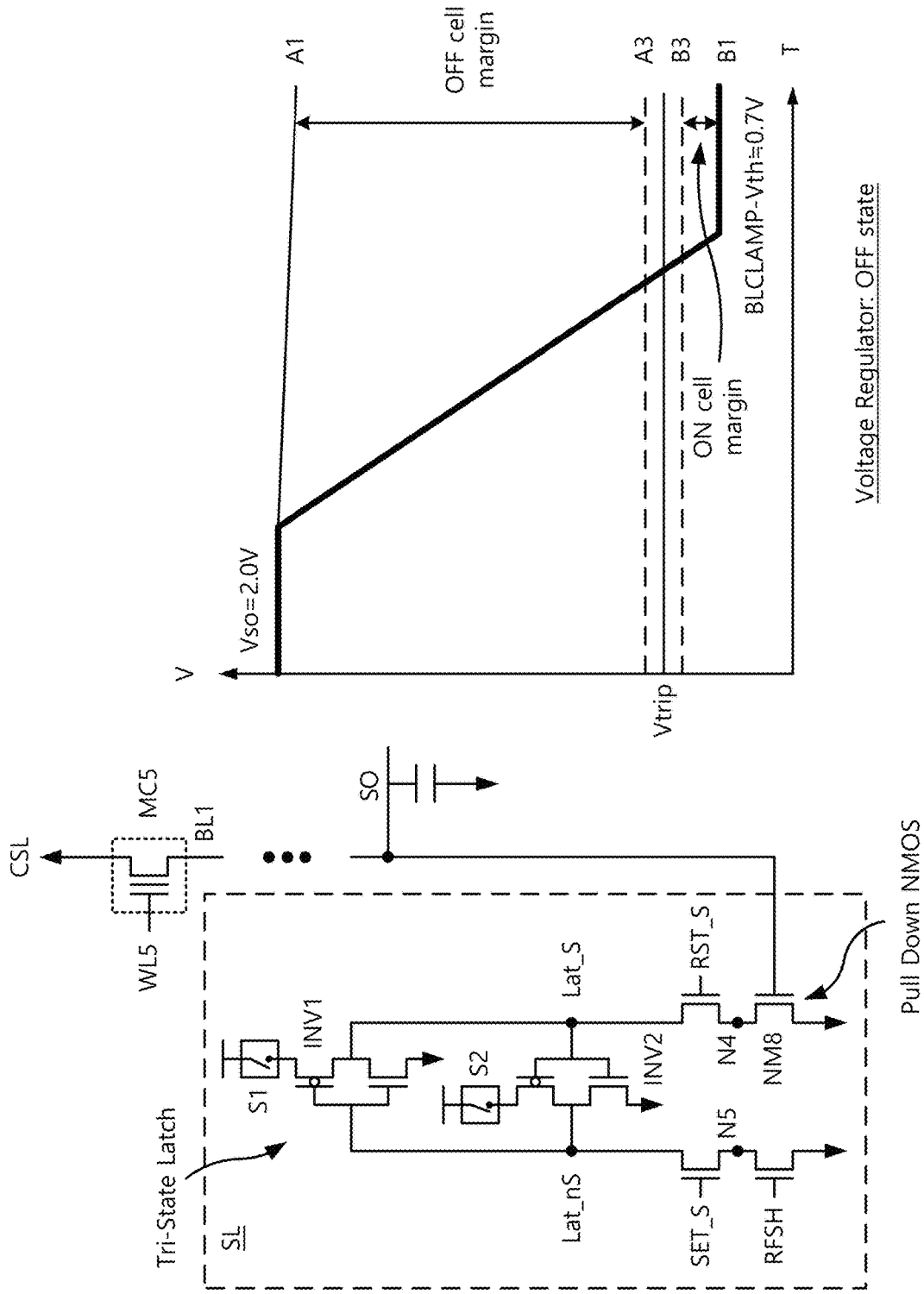
Figure 11:
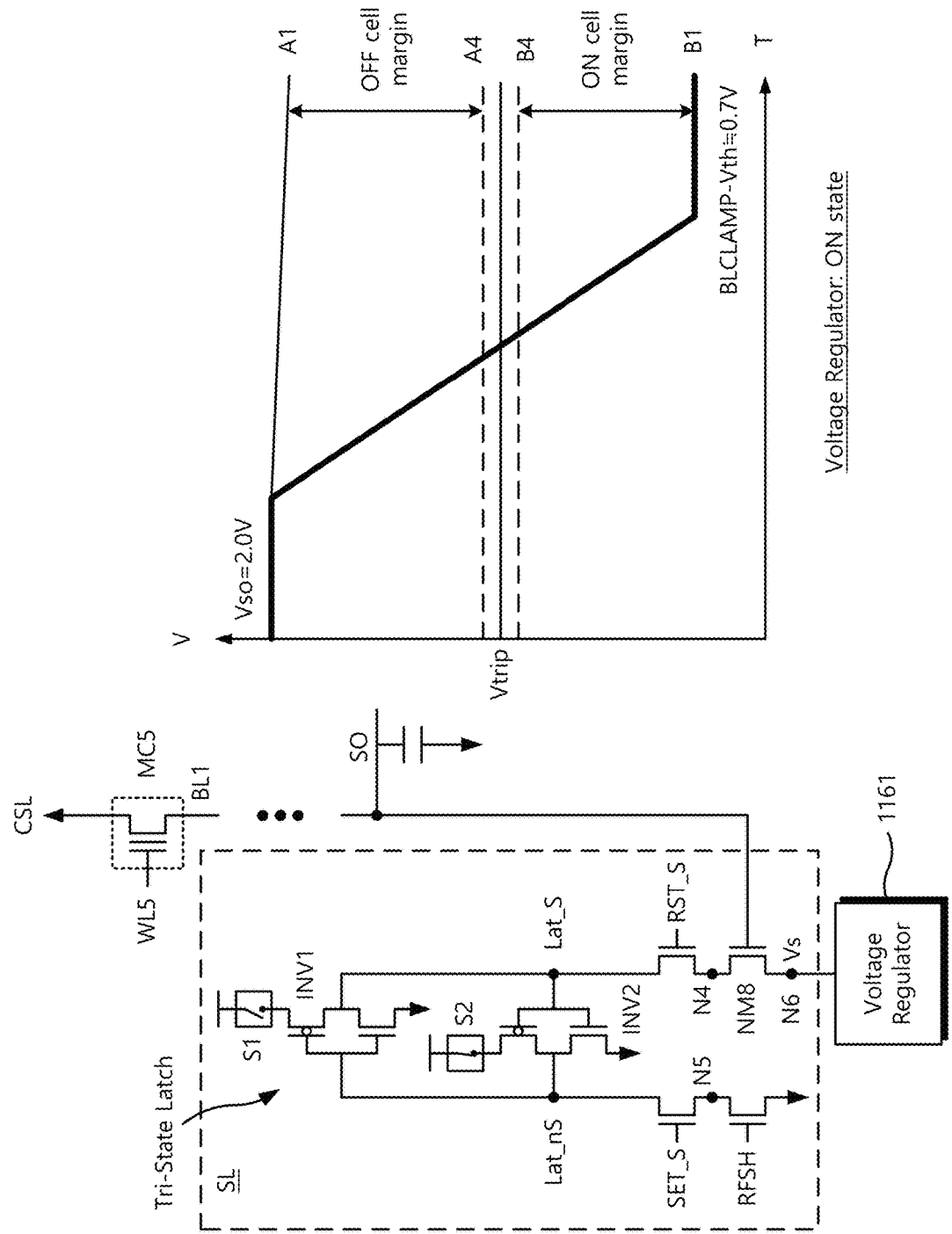
Figure 12:
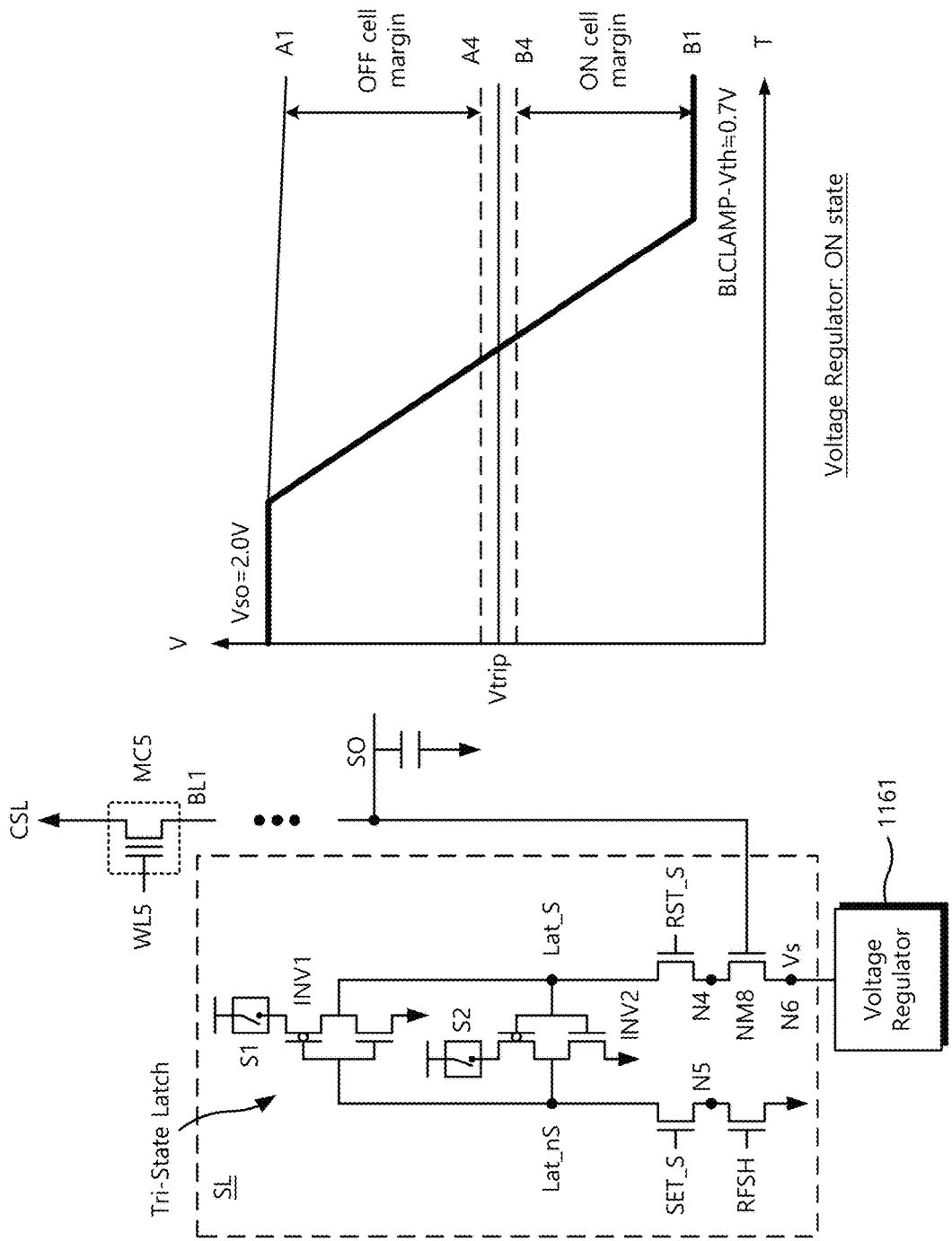

FIG. 8 to FIG. 12 are circuit diagrams and graphs for explaining an SO node sensing operation result according to an operation state of a voltage regulator. FIG. 8 shows an example in which the voltage regulator shown in FIG. 5 is in an off state and the sensing latch SL is a general latch. FIG. 9 and FIG. 10 show an example in which the voltage regulator is in an off state and the sensing latch SL is a tri-state latch. FIG. 11 and FIG. 12 show an example in which the voltage regulator is in an on state and the sensing latch SL is a tri-state latch.

Referring to FIG. 8, the sensing latch SL may include first and second inverters INV1 and INV2, and an eighth NMOS transistor NM8. The first and second inverters INV1 and INV2 may include a PMOS transistor and an NMOS transistor, respectively. An input terminal of the first inverter INV1 and an output terminal of the second inverter INV2 may be connected to the inverted latch node Lat_nS. An output terminal of the first inverter INV1 and an input terminal of the second inverter INV2 may be connected to the latch node Lat_S.

When the voltage regulator (refer to FIG. 5, 1161) is in an off state, the source of the eighth NMOS transistor NM8 may be in a ground state. In this case, as shown in FIG. 8, the PMOS transistor of the first inverter INV1 may operate as a pull-up PMOS transistor, and the eighth NMOS transistor may operate as a pull-down NMOS transistor.

The sensing latch SL may first precharge the SO node to sense data stored in the fifth memory cell MC5. When the SO node is precharged, the voltage level Vso of the SO node may be, for example, 2.0V. When the select read voltage Vrd is provided to the fifth word line WL5, the voltage level of the SO node may change according to the program state or the threshold voltage of the fifth memory cell MC5.

When the threshold voltage of the fifth memory cell MC5 is higher than the select read voltage Vrd, the fifth memory cell MC5 is an off-cell. When the fifth memory cell MC5 is an off-cell, the voltage level of the SO node maintains the A1 voltage level (e.g., about 2.0V). When the threshold voltage of the fifth memory cell MC5 is lower than the select read voltage Vrd, the fifth memory cell MC5 is an on-cell. If the fifth memory cell MC5 is an on-cell, the voltage level of the SO node will drop to the voltage level B1. The B1 voltage level may be BLCLAMP-Vth (e.g., about 0.7V).

The sensing latch SL may trip the latch node Lat_S to a logic high or a logic low according to the voltage level of the SO node. When the inverted latch node Lat_nS is a logic low, the latch node Lat_S may receive a power supply voltage through the pull-up PMOS transistor of the first inverter INV1 and become a logic high. In this state, when the SO node is at the A1 voltage level, the latch node Lat_S may be tripped to a logic low. In addition, the inverted latch node Lat_nS may be in a logic high state. Conversely, when the SO node is at the B1 voltage level, the latch node Lat_S may maintain a logic high.

As such, the sensing operation of the sensing latch SL shown in FIG. 8 has a deep relationship with the switching characteristics of the pull-up PMOS transistor of the first inverter INV1 and the pull-down NMOS transistor of the eighth NMOS transistor NMB. Accordingly, the switching characteristic of the sensing latch SL may change according to a change in threshold voltage according to temperature or a change in driving capability according to time of the pull-up PMOS transistor and the pull-down NMOS transistor.

The switching characteristic of the sensing latch SL may be determined according to the trip voltage Vtrip. The trip voltage Vtrip of the sensing latch SL may be defined as in Equation 1.

$$Vtrip = Vthn + \sqrt{\left(\frac{\mu_n Cox W}{L}\right)_p \left(\frac{L}{W \mu_n Cox}\right)_n} (IVC - Vthp) \quad \text{[Equation 1]}$$

Here, Vthn is the threshold voltage of the pull-down NMOS transistor, and Vthp is the threshold voltage of the pull-up PMOS transistor. IVC is the voltage level (Vso) of the SO node.

Even if the level of the SO node is developed enough to trip the latch node Lat_S, a correct sensing result may not actually trip to the latch node Lat_S. The sensing latch SL may define a variation range of a trip voltage (Vtrip) in consideration of such a switching characteristic. In the example of FIG. 8, the trip voltage variation ranges may be A2-Vtrip and Vtrip-B2. When the trip voltage variation range is A2-B2, the off-cell margin may be A1-A2, and the on-cell margin may be B2-B1.

The sensing latch SL shown in FIG. 8 may define a trip voltage Vtrip by a pull-up PMOS transistor and a pull-down NMOS transistor. However, the sensing latch SL shown in FIG. 9 may define a trip voltage Vtrip by a pull-down NMOS transistor.

Since the sensing latch SL shown in FIG. 9 and FIG. 10 defines the trip voltage Vtrip only with the pull-down NMOS transistor, it is possible to reduce the trip voltage variation range.

Referring to FIG. 9, the sensing latch SL may include a tri-state latch and an eighth NMOS transistor NMB. A tri-state latch may include first and second inverters INV1 and INV2. The first inverter INV1 may include a PMOS transistor, an NMOS transistor, and a first switch S1. The first switch S1 may be connected between the power terminal of the first inverter INV1 and the PMOS transistor. The second inverter INV2 may include a PMOS transistor, an NMOS transistor, and a second switch S2. The second switch S2 may be connected between the power terminal of the second inverter INV2 and the PMOS transistor.

A tri-state latch may turn off the first switch S1 during a sensing operation of the sensing latch SL. The voltage regulator (refer to FIG. 5, 1161) may be in an off state, the first switch S1 may be in an off state, and the second switch S2 may be in an on state. When the voltage regulator 1161 is in an off state, the source of the eighth NMOS transistor NM8 may be in a ground state. In this case, the sensing latch SL may perform a sensing operation using only the pull-down NMOS transistor characteristics.

The trip voltage Vtrip of the sensing latch SL may be defined as in Equation (2).

$$Vtrip = Vthn \quad \text{[Equation 2]}$$

The sensing latch SL shown in FIG. 9 may reduce a trip voltage variation range by using only the pull-down NMOS transistor characteristics. In FIG. 9, the trip voltage variation range may be A3-Vtrip and Vtrip-B3. When the trip voltage variation range is A3-B3, the off-cell margin may be A1-A3, and the on-cell margin may be B3-B1. Here, A3-Vtrip may be smaller than A2-Vtrip of FIG. 8. And Vtrip-B3 may be smaller than Vtrip-B2 of FIG. 8. In addition, the trip voltage variation range A3-B3 of FIG. 9 may be smaller than the trip voltage variation range A2-B2 of FIG. 8.

Referring to FIG. 10, a tri-state latch may turn off the first and second switches S1 and S2 during a sensing operation of the sensing latch SL. That is, the three-phase latch may turn off the first and second switches S1 and S2 and perform a sensing operation while the voltage regulator 1161 (refer to FIG. 5) is turned off. After the sensing operation, during the latch operation, the first and second switches S1 and S2 may be turned on again.

When the voltage regulator 1161 is in an off state, the source of the eighth NMOS transistor NM8 may be in a ground state. In this case, the sensing latch SL may perform a sensing operation using only the pull-down NMOS transistor characteristics.

Since the sensing latch SL shown in FIG. 9 and FIG. 10 defines the trip voltage Vtrip by the pull-down NMOS transistor, the range of the trip voltage variation can be reduced. However, since the sensing latch SL shown in FIGS. 9 and 10 defines the trip voltage Vtrip by the pull-down NMOS transistor, the ON cell margin may be reduced.

The sensing latch SL shown in FIG. 11 and FIG. 12 defines a trip voltage Vtrip as a pull-down NMOS transistor and uses a tri-state latch. Therefore, the sensing latch SL may reduce the trip voltage variation range and have a sufficient on-cell margin.

Referring to FIG. 11, the sensing latch SL may include a tri-state latch and an eighth NMOS transistor NM8. A tri-state latch may turn off the first switch S1 during a sensing operation of the sensing latch SL. The voltage regulator 1161 (refer to FIG. 5) may be in an on state, the first switch S1 may be in an off state, and the second switch S2 may be in an on state. When the voltage regulator 1161 is in an on state, the source voltage Vs may be provided to the source of the eighth NMOS transistor NM8. The trip voltage Vtrip of the sensing latch SL may be defined as in Equation 3.

$$Vtrip = Vthn + Vs \quad \text{[Equation 3]}$$

The sensing latch SL may reduce a trip voltage variation range by using only the pull-down NMOS transistor characteristics. The sensing latch SL may adjust the level of the trip voltage Vtrip by using the source voltage Vs provided to the sixth node N6. That is, the sensing latch SL may use the source voltage Vs to allow the trip voltage Vtrip to be positioned at an intermediate point between A1 and B1. The sensing latch SL may sufficiently secure the off-cell margins A1-A4 and the on-cell margins B4-B1.

Referring to FIG. 12, a tri-state latch may turn off the first and second switches S1 and S2 during a sensing operation of the sensing latch SL. That is, the sensing operation may be performed by turning off the first and second switches S1 and S2 while the voltage regulator (see FIG. 5, 1161) is on. After the sensing operation, during the latch operation, the first and second switches S1 and S2 may be turned on again.

In FIG. 11 and FIG. 12, the trip voltage variation range may be A4-Vtrip and Vtrip-B4. When the trip voltage variation range is A4-B4, the off-cell margin may be A1-A4, and the on-cell margin may be B4-B1. Here, A4-Vtrip may be smaller than A2-Vtrip of FIG. 8 and may be the same as or similar to A3-Vtrip of FIG. 9 and FIG. 10. In addition, Vtrip-B4 may be smaller than Vtrip-B2 of FIG. 8 and may be the same as or similar to Vtrip-B3 of FIGS. 9 and 10. In addition, the trip voltage variation range A4-B4 may be smaller than A2-B2 of FIG. 8, and may be the same as and/or similar to A3-B3 of FIG. 9 and FIG. 10.

Figure 13:
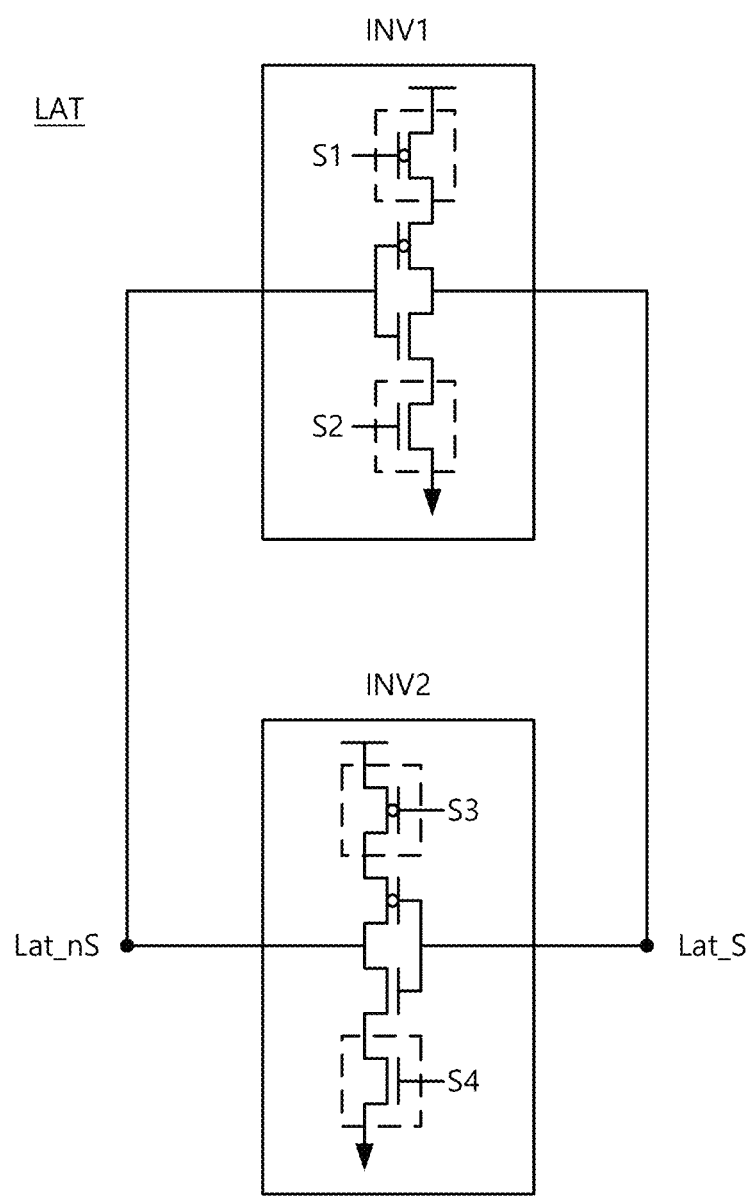
FIG. 13 is a circuit diagram illustrating a modified example of the latch shown in FIG. 5.

FIG. 13 is a circuit diagram illustrating a modified example of the latch shown in FIG. 5. Referring to FIG. 13, the latch LAT of the sensing latch SL may include first and second inverters INV1 and INV2. The latch LAT may be connected between the latch node Lat_S and the inverted latch node Lat_nS.

The first inverter INV1 may include a PMOS transistor, an NMOS transistor, a first switch S1, and a second switch S2. The first switch S1 may be connected between the power terminal and the PMOS transistor, and the second switch S2 may be connected between the NMOS transistor and the ground terminal. The second inverter INV2 may include a PMOS transistor, an NMOS transistor, a third switch S3, and a fourth switch S4. The third switch S3 may be connected between the power terminal and the PMOS transistor, and the fourth switch S4 may be connected between the NMOS transistor and the ground terminal.

The first to fourth switches S1 to S4 of the latch LAT may be variously modified and used. For example, as shown in FIG. 13, the first and third switches S1 and S3 may be implemented as PMOS transistors, and the second and fourth switches S2 and S4 may be implemented as NMOS transistors. It may be implemented in various example embodiments in which, e.g., at least one of the first to fourth switches S1 to S4 does not exist. For example, as shown in FIG. 9 and FIG. 12, the second and fourth switches S2 and S4 may omitted (or not exist). Also, the first and second switches S1 and S2 may be present in the first inverter INV1, but the third and fourth switches S3 and S4 may not exist in the second inverter INV2.

Meanwhile, the first and second inverters INV1 and INV2 may be implemented in such a way that a source voltage is applied without a ground terminal connected to the source terminal of the NMOS transistor. For example, in FIG. 13, a ground terminal may not be connected to the second and fourth switches S2 and S4, and a source voltage Vs may be provided. In addition, a trip voltage Vtrip may be provided to the second and fourth switches S2 and S4.

Figure 14:
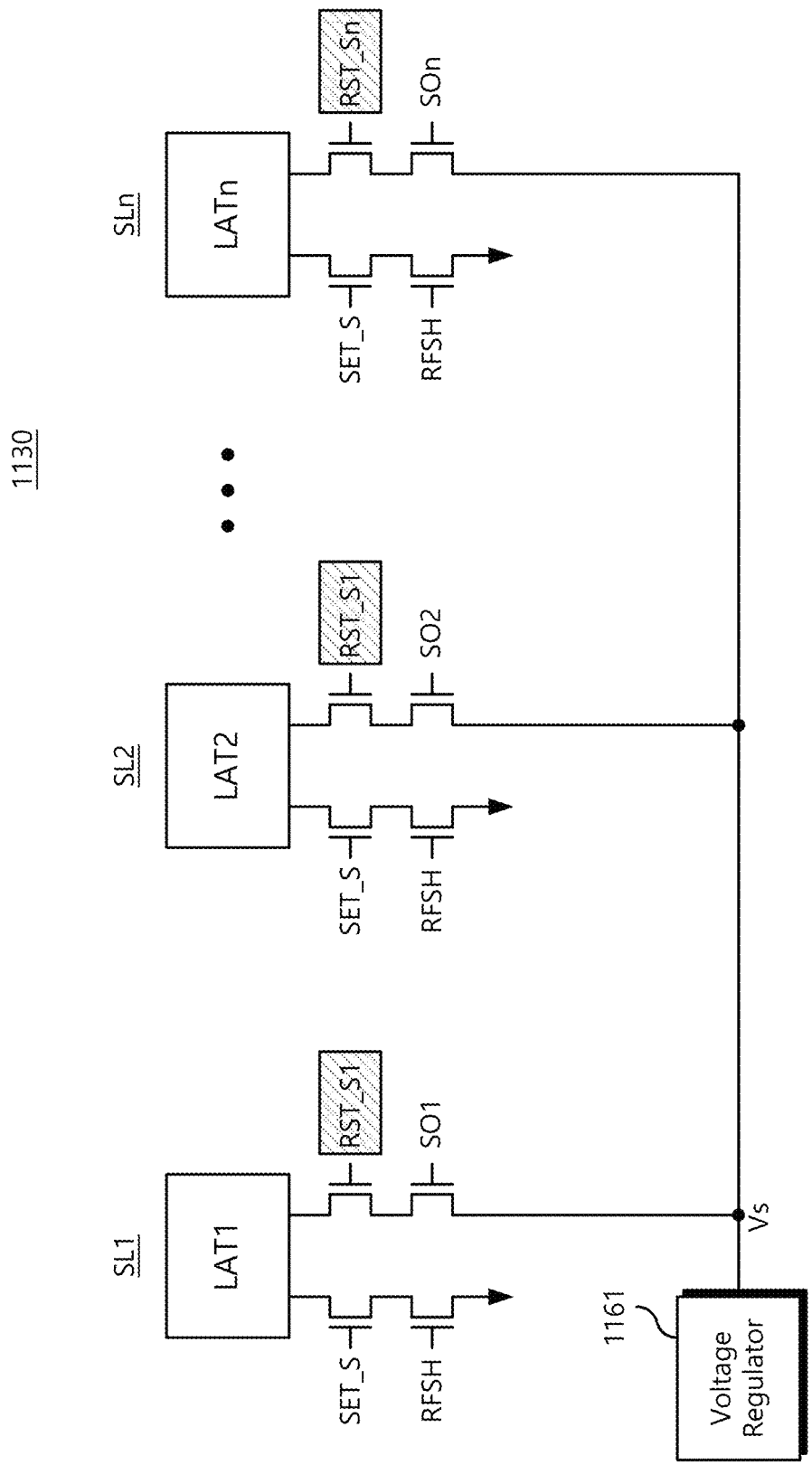
FIG. 14 is a block diagram illustrating another example of a flash memory device according to various example embodiments of the present invention.

FIG. 14 is a block diagram illustrating another embodiment of a flash memory device according to various example embodiments of the present invention. Referring to FIG. 14, the page buffer circuit 1130 may include first to nth sensing latches SL1 to SLn. The first to nth sensing latches SL1-SLn may share the voltage regulator 1161.

The voltage regulator 1161 may simultaneously provide the source voltage Vs as the source of the pull-down NMOS transistors of the first to nth sensing latches SL1-SLn. In this case, sensing operations of the first to nth sensing latches SL1 to SLn may be determined according to the first to nth sensing reset signals RST_S1 to RST_Sn. The page buffer circuit 1130 shown in FIG. 14 may reduce the peak current by determining the sensing start using the sensing reset signal.

Figure 15:
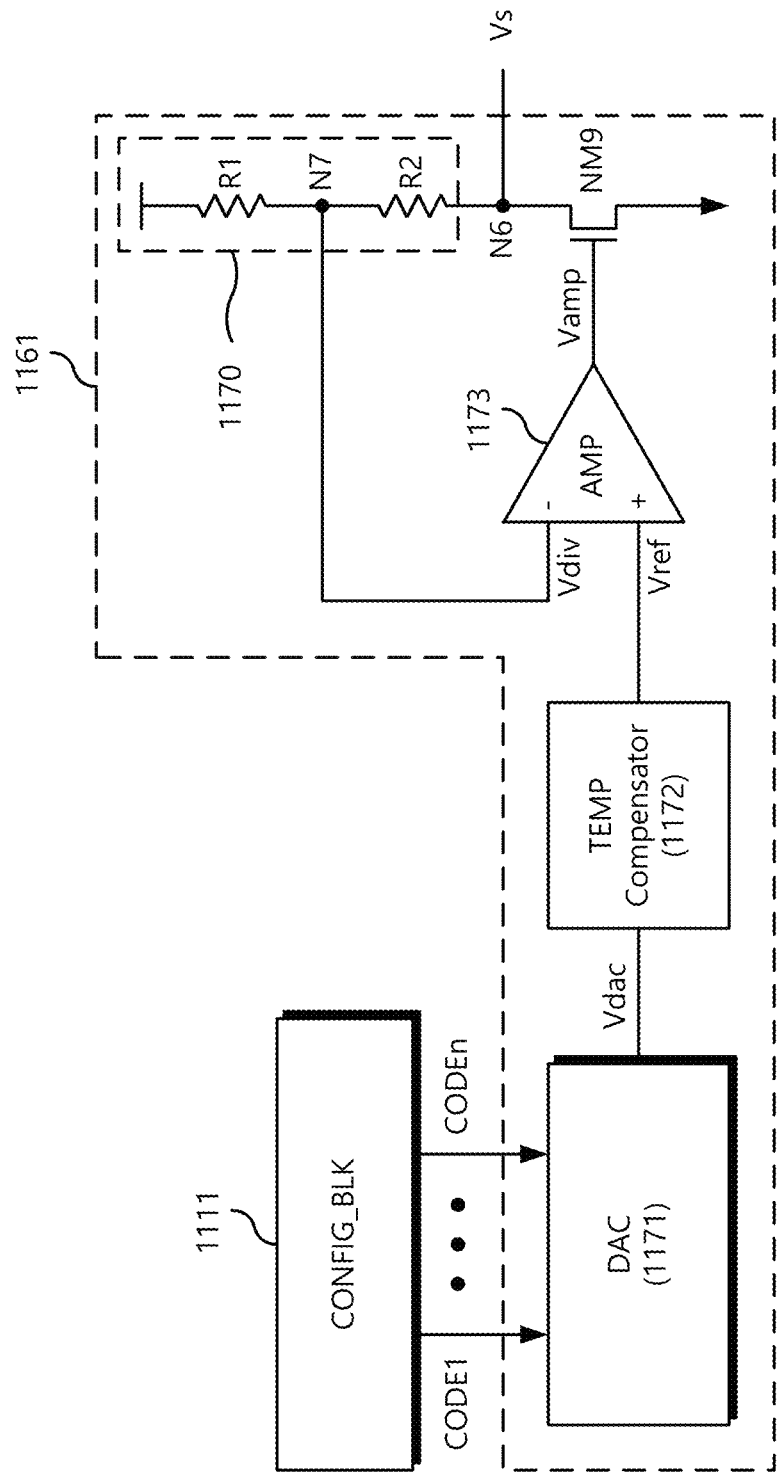
FIG. 15 is a block diagram illustrating another example of the voltage regulator shown in FIG. 5.

FIG. 15 is a block diagram illustrating another example of the voltage regulator shown in FIG. 5. Referring to FIG. 15, the voltage regulator 1161 may include a voltage divider 1170, a DA converter 1171, a temperature compensator 1172, an amplifier AMP 1173, and a ninth NMOS transistor NM9.

The DA converter 1171 may receive the first to nth digital codes CODE1 to CODEn from the configuration memory block 1111 and provide the DAC output voltage Vdac to the temperature compensator 1172. The temperature compensator 1172 may compensate for the threshold voltage variation of the transistor according to the temperature change. For example, the temperature compensator 1172 may internally include a temperature compensation transistor to compensate for a change in the threshold voltage of the eighth NMOS transistor NM8.

The temperature compensator 1172 may receive the DAC output voltage Vdac and perform a temperature compensation operation using a temperature compensation transistor. The temperature compensator 1172 may generate a temperature compensator output voltage by reflecting the temperature compensation result. The temperature compensator output voltage may be provided to an input terminal of the amplifier 1173 as a reference voltage Vref.

The amplifier 1173 may generate the amplifier output voltage Vamp by using the reference voltage Vref and the divided voltage Vdid. The ninth NMOS transistor NM9 may adjust the voltage level of the sixth node N6 in response to the voltage level of the amplifier output voltage Vamp. The voltage regulator 1161 may provide the source voltage Vs to the sixth node N6. The source voltage Vs may be provided to the source terminal of the eighth NMOS transistor NM8.

The flash memory device 1100 according to various example embodiments of the present invention may reduce a trip voltage variation range by using only the pull-down NMOS transistor characteristics. Also, according to the present invention, an OFF cell margin and an ON cell margin can be sufficiently secured by adjusting the level of the trip voltage Vtrip using the source voltage Vs.

While example embodiments have been described with reference to embodiments thereof, it will be apparent to those of ordinary skill in the art that various changes and modifications may be made thereto without departing from the spirit and scope of various example embodiments as set forth in the following claims. Furthermore, example embodiments are not necessarily mutually exclusive with one another. For example, some example embodiments may include one or more features described with reference to one or more figures and may also include one or more other features described with reference to one or more other figures.

What is claimed is:

1. A flash memory device comprising:
 a cell string including a plurality of memory cells;
 a page buffer connected to the cell string and a bit line and configured to sense data stored in a selected memory cell from among the plurality of memory cells by precharging a sensing node connected to the bit line; and
 a voltage regulator configured to provide a source voltage to the page buffer,
 wherein the page buffer comprises
  a latch including first and second inverters coupled between a latch node and an inverted latch node, and
  a pull-down n-type metal-oxide-semiconductor ("NMOS") transistor configured to define a trip voltage provided to the latch node based on a result of the sensing of the data stored in the selected memory cell, and
 wherein the voltage regulator is configured to adjust the-trip voltage by providing the source voltage to the pull-down NMOS transistor.

2. The flash memory device of claim 1, wherein a gate of the pull-down NMOS transistor is connected to the sensing node, and a source of the pull-down NMOS transistor is configured to be provided with the source voltage.

3. The flash memory device of claim 2, wherein the page buffer is configured to receive the source voltage from the voltage regulator and to increase the trip voltage during a sensing operation.

4. The flash memory device of claim 1, wherein the latch is a tri-state latch comprising p-type metal-oxide-semiconductor ("PMOS") transistors and NMOS transistors.

5. The flash memory device of claim 4, wherein the first inverter includes a pull-up PMOS transistor, and
 wherein the flash memory device is configured such that the pull-up PMOS transistor is cut off from a power supply terminal during a sensing operation.

6. The flash memory device of claim 5, wherein the first inverter further comprises a switch circuit between the power supply terminal and the pull-up PMOS transistor.

7. The flash memory device of claim 6, wherein the switch circuit includes a second-PMOS transistor.

8. The flash memory device of claim 1, wherein the voltage regulator comprises a digital-to-analog ("DA") converter configured to receive digital codes and generate the source voltage during a booting operation of the flash memory device.

9. The flash memory device of claim 8, wherein the voltage regulator further comprises a temperature compensator configured to compensate for a threshold voltage variation according to a temperature of the pull-down NMOS transistor.

10. The flash memory device of claim 1, wherein the plurality of memory cells included in the cell string are arranged in a vertical direction with respect to a substrate.

11. A flash memory device comprising:
a first sensing latch coupled to a first bit line;
a second sensing latch coupled to a second bit line; and
a voltage regulator configured to provide a source voltage to the first and second sensing latches,
wherein each of the first and second sensing latches comprises
a latch comprising first and second inverters coupled between a latch node and an inverted latch node; and
a pull-down n-type metal-oxide-semiconductor (NMOS) transistor configured to define a trip voltage, provided to the latch node, based on a result of sensing data stored a selected memory cell, and
wherein the voltage regulator is configured to adjust the trip voltage by providing the source voltage to the pull-down NMOS transistor.

12. The flash memory device of claim 11, wherein each of the first and second sensing latches further comprises an NMOS transistor configured to determine a sensing start between the latch and the pull-down NMOS transistor.

13. The flash memory device of claim 11, wherein a gate of the pull-down NMOS transistor is connected to a sensing node, and a source of the pull-down NMOS transistor is configured to be provided with the source voltage.

14. The flash memory device of claim 11, wherein the latch is a tri-state latch comprising p-type metal-oxide-semiconductor ("PMOS") transistors and NMOS transistors.

15. The flash memory device of claim 14, wherein the first inverter includes a pull-up PMOS transistor, and wherein the flash memory device is configured such that the pull-up PMOS transistor is cut off from a power terminal during a sensing operation.

16. A sensing method of a flash memory device, comprising:
precharging a sensing node connected to a bit line;
developing the precharged charges in the sensing node according to data stored in a selected memory cell;
providing a source voltage to a sensing latch coupled to the sensing node; and
defining a trip voltage provided to a latch node of the sensing latch based on the data stored in the selected memory cell and on the source voltage provided to the sensing latch.

17. The sensing method of claim 16, wherein the sensing latch comprises
an inverted latch node;
a latch comprising first and second inverters coupled between the latch node and the inverted latch node; and
a pull-down n-type metal-oxide-semiconductor ("NMOS") transistor for tripping the sensing result of the selected memory cell to the latch node,
wherein the flash memory device is configured to adjust the trip voltage by providing the source voltage to the pull-down NMOS transistor.

18. The sensing method of claim 17, wherein the first inverter includes a pull-up p-type metal-oxide-semiconductor ("PMOS") transistor, and further comprising:
cutting off the pull-up PMOS transistor from a power terminal during a sensing operation.

19. The sensing method of claim 17, further comprising:
loading digital codes stored in a memory cell array into a voltage regulator during a booting operation of the flash memory device; and
generating the source voltage using the digital codes.

20. The sensing method of claim 19, further comprising:
compensating a threshold voltage variation according to a temperature of the pull-down NMOS transistor during the voltage regulator generating the source voltage.

* * * * *